(12) United States Patent
Cappellani et al.

(10) Patent No.: US 8,507,948 B2
(45) Date of Patent: Aug. 13, 2013

(54) JUNCTIONLESS ACCUMULATION-MODE DEVICES ON PROMINENT ARCHITECTURES, AND METHODS OF MAKING SAME

(75) Inventors: Annalisa Cappellani, Portland, OR (US); Kelin J. Kuhn, Aloha, OR (US); Rafael Rios, Portland, OR (US); Titash Rakshit, Hillsboro, OR (US); Sivakumar P. Mudanai, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 189 days.

(21) Appl. No.: 12/978,248

(22) Filed: Dec. 23, 2010

(65) Prior Publication Data
US 2012/0161202 A1 Jun. 28, 2012

(51) Int. Cl.
*H01L 29/66* (2006.01)

(52) U.S. Cl.
USPC .... 257/192; 257/347; 257/288; 257/E29.242; 257/E21.409; 257/E21.158; 438/197; 438/478; 438/157; 438/270

(58) Field of Classification Search
USPC .......... 257/192, 347.288, E29.242, E21.409, 257/E21.158; 438/197, 478, 157, 270
See application file for complete search history.

(56) References Cited

U.S. PATENT DOCUMENTS

| | | | |
|---|---|---|---|
| 2009/0184369 A1* | 7/2009 | Zhu | 257/347 |
| 2010/0052059 A1* | 3/2010 | Lee | 257/368 |
| 2010/0202184 A1* | 8/2010 | Lee | 365/96 |
| 2012/0220102 A1* | 8/2012 | Or-Bach et al. | 438/458 |

* cited by examiner

*Primary Examiner* — Cathy N Lam
(74) *Attorney, Agent, or Firm* — Finch & Maloney PLLC

(57) ABSTRACT

A junctionless accumulation-mode (JAM) semiconductive device is isolated from a semiconductive substrate by a reverse-bias band below a prominent feature of a JAM semiconductive body. Processes of making the JAM device include implantation and epitaxy.

17 Claims, 11 Drawing Sheets

JUNCTIONLESS ACCUMULATION-MODE DEVICES ON PROMINENT ARCHITECTURES, AND METHODS OF MAKING SAME

Disclosed embodiments relate to junctionless accumulation mode transistor devices and processes of making them.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which.

DETAILED DESCRIPTION

Processes are disclosed where quantum wire and quantum fin transistors that operate in junctionless accumulation mode (JAM) are fabricated with a reverse-bias body that resists leakage or renders leakage negligible. The processes are described with wafer-level processing embodiments, but the processes may also be applied to die-level processing.

Reference will now be made to the drawings wherein like structures may be provided with like suffix reference designations. In order to show the structures of various embodiments more clearly, the drawings included herein are diagrammatic representations of integrated circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings.

Figure 1:
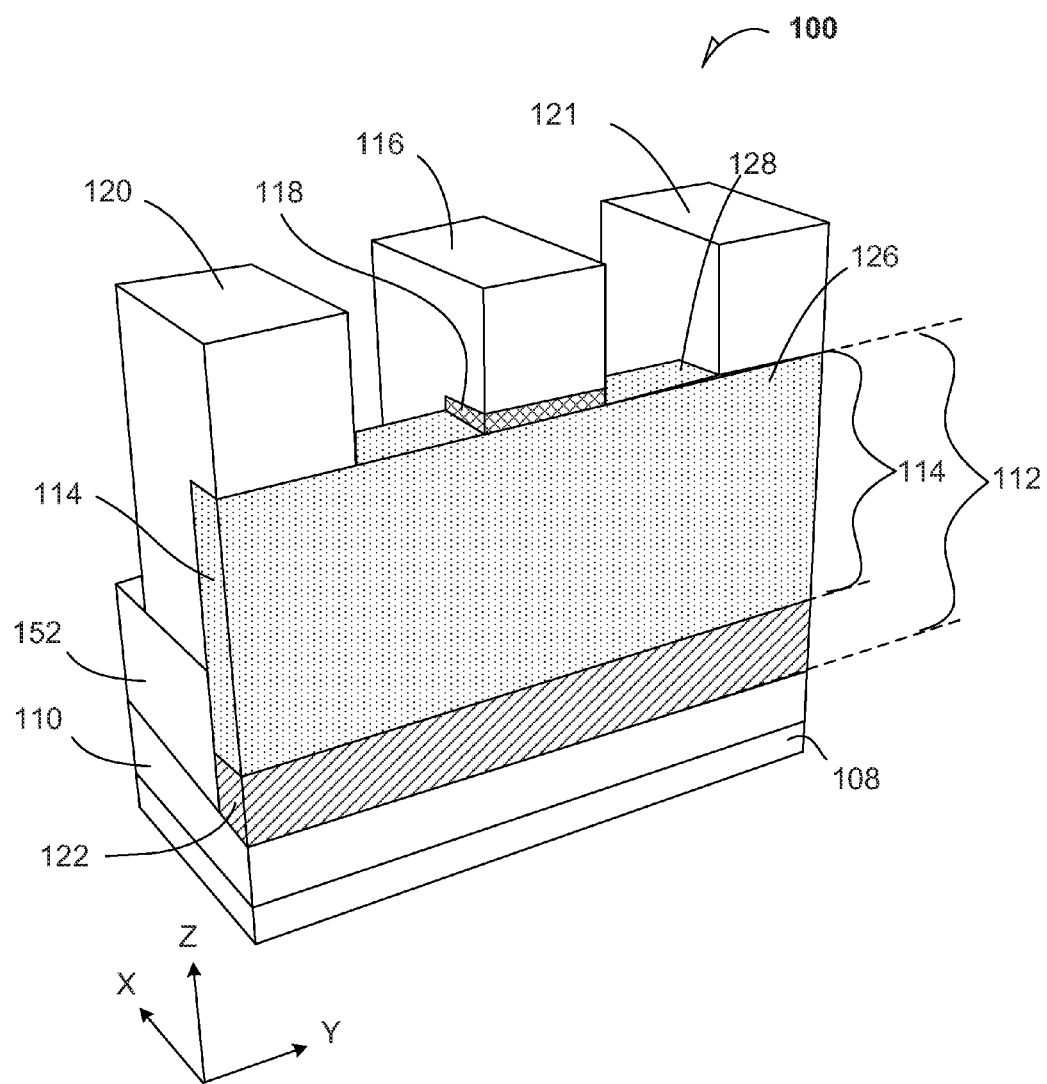
FIG. 1 is a cross-section and cut-away perspective elevation of a semiconductive device according to an example embodiment.

FIG. 1 is a cross-section and cut-away perspective elevation of a semiconductive device 100 according to an example embodiment. The semiconductive device 100 includes a semiconductive substrate 110 which may be disposed above an SOI structure 108. In an embodiment, the semiconductive substrate 110 is an epitaixilly grown film. In an embodiment, the SOI structure 108 is a buried oxide layer. A prominence 112 includes a semiconductive first body 114. The prominence 112 may also be referred to as a fin 112. In an embodiment, the prominence 112 has an aspect ratio from greater than 1 (such as 1.1:1) to 16:1. In an embodiment, the aspect ratio is in a range from 6:1 to 10:1. Other aspect ratios may be useful depending up a given application. For example, the aspect ratios given are useful for fin prominences. Aspect ratios for quantum ribbons or quantum wires may each have different useful dimensions. In an embodiment, the source- and drain bodies 120 and 121, respectively, are doped the same as the semiconductive first body 114. In an embodiment, the source- and drain bodies 120 and 121, respectively, are doped differently from that of the semiconductive first body 114. For example, the source- and drain bodies 120 and 121, respectively, are doped higher than that of the semiconductive first body 114, but all are qualitatively doped the same.

In an example embodiment, the source- and drain bodies 120 and 121, respectively, are doped the same as the semiconductive first body 114 such as they are each p-doped and function as a p-doped JAM semiconductor, and the reverse-bias second body 122 is n-doped. In an example embodiment, the source- and drain bodies 120 and 121, respectively, are doped the same as the semiconductive first body 114 such as they are each n-doped and function as an n-doped JAM semiconductor, and the reverse-bias second body 122 is p-doped. The semiconductive first body 114 may also be delineated by a first side 126, an edge 128, and a second side (obscured from view) that is parallel planar to the first side 126. It can now be seen that the semiconductive first body 114 extends (from left to right) from the source body 120, through the gate electrode 116 and to the drain body 121.

In an embodiment, the top substrate 110 is an epitaxially grown undoped semiconductor layer that has been formed upon the bottom substrate 108, which is foundry-doped semiconductor. In a first example embodiment, the semiconductive first body 114 is n-doped silicon, the top substrate 110 is undoped silicon and the bottom substrate 108 is also n-doped silicon. In a second example embodiment, the semiconductive first body 114 is n-doped silicon, the top substrate 110 is undoped silicon and the bottom substrate 108 is p-doped silicon. In a third example embodiment, the semiconductive first body 114 is p-doped silicon, the top substrate 110 is undoped silicon, and the bottom substrate 108 is also p-doped silicon. In a fourth example embodiment, the semiconductive first body 114 is p-doped silicon, the top substrate 110 is undoped silicon, and the bottom substrate 108 is n-doped silicon.

In an embodiment, the top substrate 110 is a dielectric material and the band 122 is also a dielectric material. In this embodiment, the bottom substrate 108 is foundry-doped semiconductive material and may be referred to as the semiconductive second body 108 in contrast to the semiconductor first body 114 and in place of the structure 122 when it is reverse-biased instead of a dielectric material. Consequently, the dielectric 122 is part of the prominence 112. In a fifth example embodiment, the semiconductive first body 114 is n-doped silicon, the band 122 is an oxide (that may be formed such as at a processing stage 322 depicted in FIG. 3a), the top substrate is a dielectric such as a foundry-delivered dielectric layer 110, and the bottom substrate 108 is foundry-delivered semiconductive material. In this fifth example embodiment, the bottom substrate 108 is also n-doped silicon. In a sixth example embodiment, all the conditions of the fifth example embodiment are the same with a difference that the bottom substrate 108 is p-doped silicon. In a seventh example embodiment, all the conditions of the sixth example embodiment are present with the difference that the semiconductive first body 114 is p-doped silicon.

The semiconductive first body 114 is a JAM device such as an n-channel junctionless source-channel- and drain device that operates in accumulation mode as a transistor. In an embodiment, the semiconductive first body 114 operates in quantum-well fashion due to the width in the X direction. In an embodiment, the semiconductive first body 114 has a width in a range from 1 nm to 100 nm. The semiconductive device 100 is displayed with at least one cut-away view. A cut-away view is seen with the Y-Z plane, which is cut into the semiconductive first body 114 such as to bifurcate it. A gate electrode 116 undulates over the semiconductive first body 114. The gate electrode 116 is insulated from the semiconductive substrate 110 as well as the prominence 112 by a gate dielectric 118. Shallow-trench isolations (STIs) 152 are also present and are at least partially depicted. The gate electrode 116 is also exposed by the cut-away plane Y-Z. The semiconductive first body 114 is coupled to a source body 120 and a drain body 121. The source- and drain bodies 120 and 121, respectively, may also be referred to as a contact pads to receive contacts for functioning of the semiconductive first body 114 in JAM operation. According to an embodiment, the prominence 112 also includes a reverse-bias band 122. Formation of the prominence 112 includes an etching process. The semiconductive first body 114 may also be delineated by a first side 126, an edge 128, and a second side (obscured from view) that is parallel planar to the first side 126. It can now be seen that the semiconductive first body 114 extends (from left to right) from the source body 120, through the gate electrode 116 and to the drain body 121. In an embodiment, doping levels of the S/D 120/121 are higher than that of the channel of the semiconductive first body 114. In an example embodiment, the S/D areas 120/121 are doped at 1e21 and the semiconductive first body 114 is doped at 1e18 by contrast.

The entire structure of the semiconductive first body 114 is an n-channel that operates in junctionless accumulation mode according to an example embodiment. The reverse-bias band 122 is disposed opposite the edge 128 and runs the entire length of the semiconductive first body 114.

In an embodiment, where the semiconductive first body 114 is an n-channel, the reverse-bias band 122 is a p-type semiconductive structure that extends beneath the entire length of the semiconductive first body 114. In an embodiment, where the semiconductive first body 114 is an n-doped channel, the reverse-bias band 122 is differently doped, i.e. p-doped and the doping differential is sufficient to act as a reverse-bias junction.

As a consequence of the doping differential between the semiconductive first body 114 and the semiconductive second body 122, the JAM semiconductive first body 114 may operate with minimal or even negligible leakage into the semiconductive substrate 110.

Other prominences may be aligned adjacent or near the semiconductive first body and coupled to the gate diode 116 in order to make multiple gate devices.

It may now be appreciated that "reverse bias" may include an embodiment where the bias is different between the semiconductive first body 114 and the semiconductive second body 122; it may therefore be called a differential bias so long as it is effective to restrict current leakage into the bulk semiconductive substrate 110. For example, In an embodiment, the doping in the semiconductive first body 114 may be a first type such as n-type and the semiconductive second body 122 is opposite doped p-doped silicon or p-doped gallium arsenide, but the doping differential is significantly different such that leakage from the semiconductive first body 114 to the semiconductive second body is minimal or even negligible. In an example embodiment, the semiconductive first body 114 is n-doped to a range of 1e15 to 1e19 and the semiconductive second body 122 is p-doped to a level of 1e19.

As a consequence of the doping differential between the semiconductive first body 114 and the semiconductive second body 122, the JAM semiconductive first body 114 may operate with minimal or even negligible leakage into the semiconductive substrate 110.

In an example embodiment, the source- and drain bodies 120 and 121, respectively, are doped the same as the semiconductive first body 114 such as they are each p-doped and function as a p-doped JAM semiconductor, and the reverse-bias second body 122 is n-doped. In an example embodiment, the source- and drain bodies 120 and 121, respectively, are doped the same as the semiconductive first body 114 such as they are each n-doped and function as an n-doped JAM semiconductor, and the reverse-bias second body 122 is p-doped.

In an embodiment, band engineering techniques are used to achieve a low- or negligible leakage from the semiconductive first body 114 into the top substrate 110 when it is semiconductive. In this embodiment, the channel 114 is a material such as germanium (Ge) and the structure 122 is gallium arsenide (GaAs). The stack of GaAs 122 and Ge 114 will resist block subsurface leakage for a JAM device. In an embodiment, the GaAs band 122 is not doped and junction leakage issues are negligible or nonexistent. Band offsets between, e.g., a Ge channel 114 and a GaAs band 122 is useful for suppressing leakage for an nJAM. In an nJAM device, a lower Vcc is used because the band offset is small by comparison to a pJAM device. In an embodiment, band offsets between, e.g., a Ge channel 114 and a GaAs band 122 is useful for suppressing leakage for a pJAM device. Other materials may be used for band-engineering embodiments.

Figure 1A:
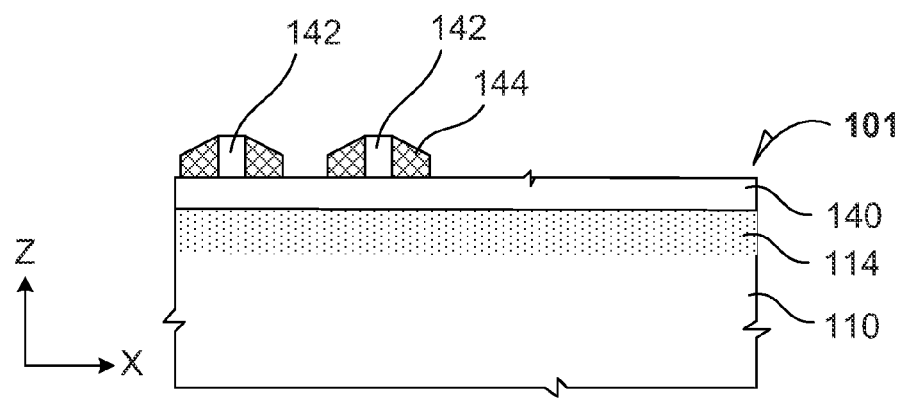
FIG. 1a is a cross-section elevation of the semiconductive device depicted in FIG. 1 during processing according to an example embodiment.

FIG. 1a is a cross-section elevation of the semiconductive device depicted in FIG. 1 during processing according to an example embodiment. The semiconductive device 101 includes the semiconductive substrate 110 that is depicted in FIG. 1. The semiconductive substrate 110 is depicted with a JAM channel body 114 that has been doped such as with phosphorus to make the channel body 114 an n-doped semiconductor. In an embodiment, an undoped semiconductive substrate 110 has been implanted to a depth of 500 Angstrom (Å) and to a doping concentration in a range from $1\text{ e}18\text{ cm}^{-3}$ to $1\text{ e}20\text{ cm}^{-3}$. For example, arsenic (As) has been implanted before any patterning of the semiconductive substrate 110. Thereafter, an anneal process has been carried out to heal dislocations and other crystal-lattice imperfections.

A hard mask 140 has been formed over the channel body 114 for further processing. In an embodiment, the hard mask 140 is an oxide and nitride such as a thermal oxide followed by nitridation to form an oxide- and oxynitride hard mask 140. Other hard mask structures may be formed according to a given utility. After formation of the hard mask 140, a polysilicon layer has been formed and patterned into a patterned polysilicon dummy layer 142. The patterned polysilicon dummy layer 142 may also be referred to as a backbone 142. The patterned polysilicon dummy layer 142 has further been blanketed with a spacer film and a spacer etch has been accomplished to leave spacers 144. The spacers 144 along with the hard mask 140 are used as a composite hard mask for forming the prominences set forth in this disclosure according to an etching embodiment.

Figure 1B:
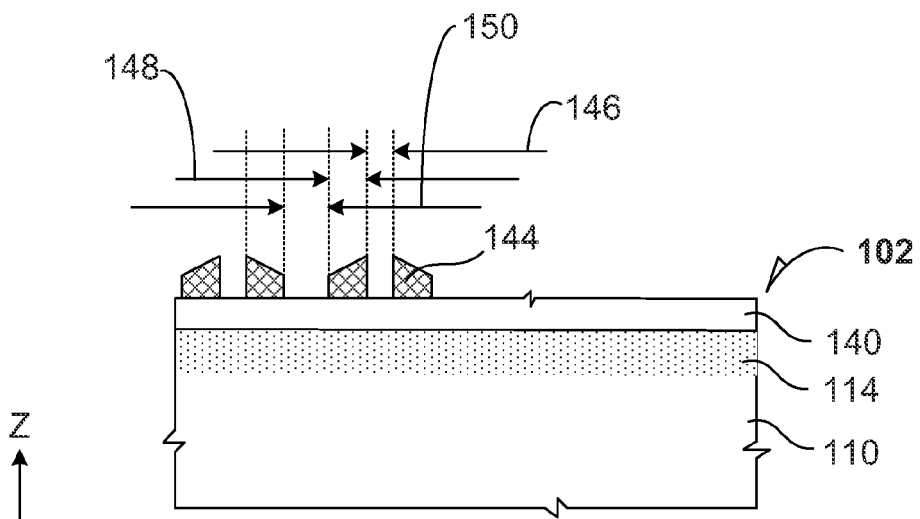
FIG. 1b is a cross-section elevation of the semiconductive device depicted in FIG. 1a after further processing according to an embodiment.

FIG. 1b is a cross-section elevation of the semiconductive device depicted in FIG. 1a after further processing according to an embodiment. The semiconductive device 102 has been processed after the spacer etch to form the spacers 144. The polysilicon dummy layer 142 has been removed (backbone 142 removal) such as by a wet etch (or a dry etch or a combination of both) that is selective to leaving the hard mask 140 and the spacers 144. In an embodiment, the spacers 144 as well as the hard mask 140 have a similar selectivity to remaining after a wet etch that is configured to remove the patterned dummy layer 142.

It can be seen that three geometries remain after backbone 142 removal. A first geometry 146 is the gap 146 between two adjacent spacers that shared a common backbone. For example, critical-dimension (CD) patterning may be patterning on a 32 nanometer (nm), a 22 nm, or even a 15 nm geometry and the CD is reflected by the first geometry 146 from the patterned polysilicon dummy layer 142. A second geometry 148 is the width of the spacer 144 after the spacer etch and the blanket etch. It may be appreciated that a spacer etch may leave the spacer 144 with a width 148 that is less than the CD of the process. A third geometry 150 is the gap 150 between two adjacent spacers that did not share a common backbone. It may be appreciated that this third geometry 150 may also be less than the CD of the process where two adjacent patterned polysilicon dummy layers 142 (e.g. see FIG. 1a) may be more than the process CD, but their overall relative position may leave a gap 150 that is less than the CD 146 after the spacer etch.

Figure 1C:
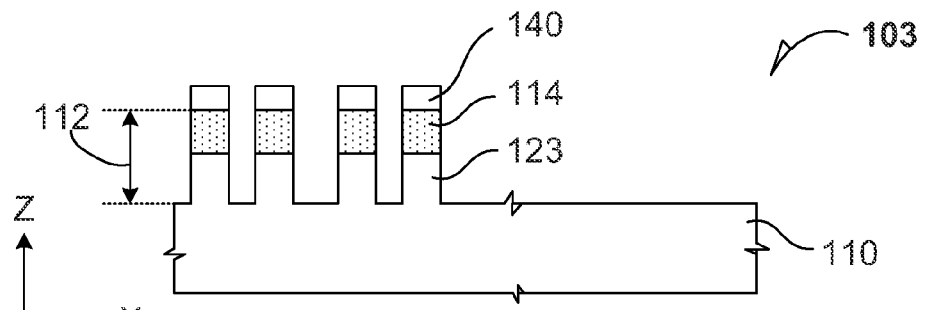
FIG. 1c is a cross-section elevation of the semiconductive device depicted in FIG. 1b after further processing according to an example embodiment.

FIG. 1c is a cross-section elevation of the semiconductive device depicted in FIG. 1b after further processing according to an example embodiment. The semiconductive device 103 has been processed with a directional etch through the hard mask 140 (and 144 depicted in FIG. 1b) to form the prominence 112 that is seen at least dimensionally in FIG. 1. Etching has isolated the channel body 114 above the bulk of the semiconductive substrate 110, but some leakage may occur into an unfinished region 123 that represents the area taken up by the reverse-bias band 122 and the undoped subprominence 124 depicted in FIG. 1.

Figure 1D:
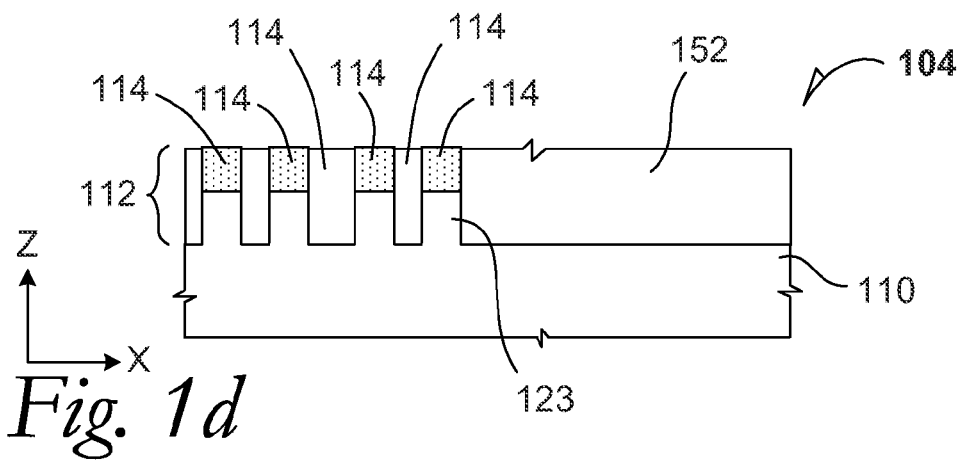
FIG. 1d is a cross-section elevation of the semiconductive device depicted in FIG. 1c after further processing according to an embodiment.

FIG. 1d is a cross-section elevation of the semiconductive device depicted in FIG. 1c after further processing according to an embodiment. The semiconductive device 104 has been processed by filling shallow-trench isolation (STI) structures 152 between the several prominences 112. The STI structures 152 (hereinafter STI 152) act to isolate each prominence 112 for more useful accumulation-mode operation.

Figure 1E:
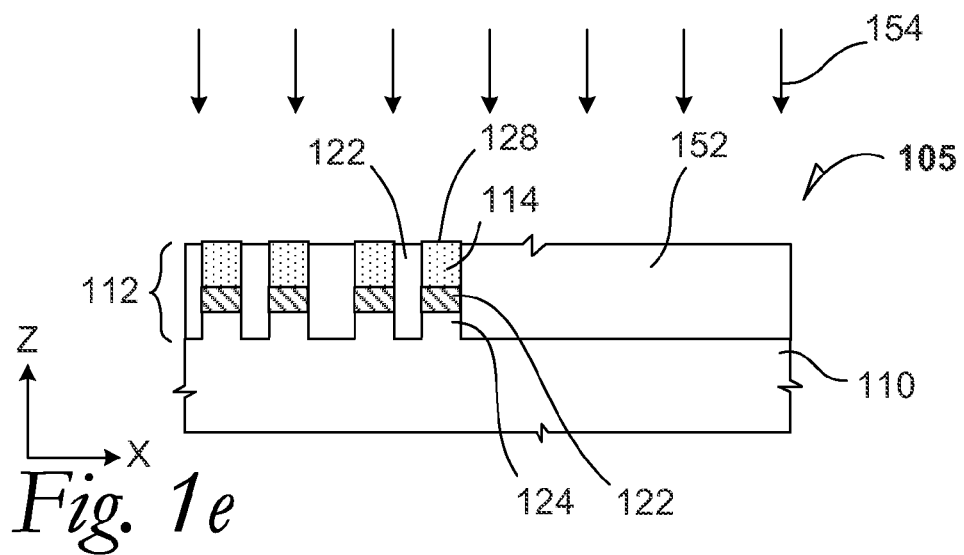
FIG. 1e is a cross-section elevation of the semiconductive device depicted in FIG. 1d after further processing according to an embodiment.

FIG. 1e is a cross-section elevation of the semiconductive device depicted in FIG. 1d after further processing according to an embodiment. The semiconductive device 105 has been processed by implanting the semiconductive second body 122 below the semiconductive first body 114. As disclosed, the semiconductive second body 122 is reverse biased with respect to the semiconductive first body 114. In an embodiment where the semiconductive first body 114 is a junctionless n-source-channel- and drain semiconductor that works in a JAM configuration, implantation (as indicated by the directional arrows 154) of a p-source is carried out such as boron (B) doping. The implantation process causes the semiconductive second body 122 to form along the entire length (in the Y direction, see FIG. 1) opposite the edge 128 of the first semiconductive body 114. As a result of the process of locating the semiconductive second body 122 below the semiconductive first body 114, leakage during JAM transistor device operation is reduced or even made negligible.

Figure 1F:
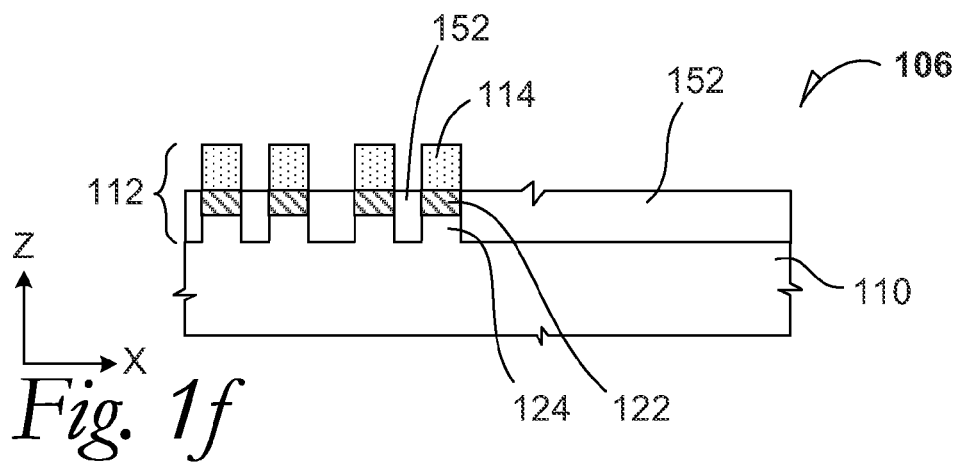
FIG. 1f is a cross-section elevation of the semiconductor device depicted in FIG. 1e after further processing according to an embodiment.

FIG. 1f is a cross-section elevation of the semiconductor device depicted in FIG. 1e after further processing according to an embodiment. The semiconductor device 106 has been altered with an etch-back process that lowers the height of the STI 152 in order to expose at least some of the semiconductive first body 114 portion of the prominence 112. Exposure of the semiconductive first body 114 enables further processing to lay down the gate dielectric 118 (see FIG. 1) followed by the gate electrode 116.

Further processing includes formation of the source body 120 and the drain body 121 having a level of dopant that might differ from the channel.

Figure 2A:
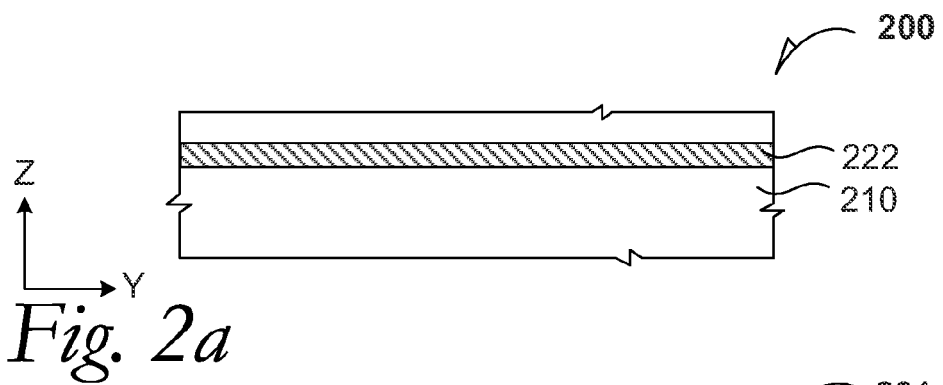
FIG. 2a is a cross-section elevation of a semiconductive device during processing according to an example embodiment.

FIG. 2a is a cross-section elevation of a semiconductive device 200 during processing according to an example embodiment. Processing includes first implantation of the reverse-bias band 222 into the bulk form factor of the semiconductive substrate 210. Thereafter, thermal processing may be done to heal imperfections and other crystal defects caused by the implanting process. By this embodiment, the thermal budget may be of lesser concern at the process stage because the prominence has not been formed.

Figure 2B:
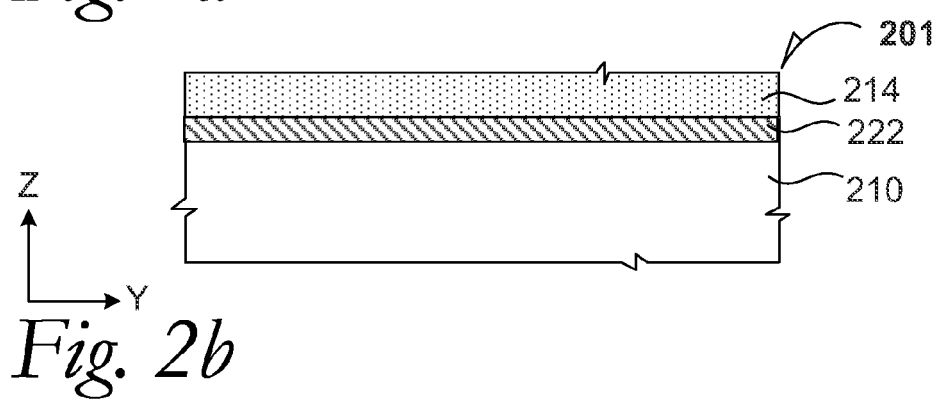
FIG. 2b is a cross-section elevation of the semiconductive device depicted in FIG. 2a after further processing according to an example embodiment.

FIG. 2b is a cross-section elevation of the semiconductive device depicted in FIG. 2a after further processing according to an example embodiment. The semiconductive device 210 has been processed by implanting a precursor to the semiconductive first body 214 into the section above the precursor to the semiconductive second body 222. In an embodiment, thermal processing may be carried out to heal imperfections in the precursor to the semiconductive first body 214. It may now be seen that thermal processing may be done once after formation of the precursor to the semiconductive first body 214 such that imperfections may be healed in the entire structure. It may now also be appreciated that the semiconductive first body 214 is pre-doped at the wafer-supplier stage of processing such that no additional doping may be needed to achieve the semiconductive first body 214 after implanting the reverse-bias band 222 as seen in FIG. 2a.

Further processing may be carried out on the semiconductive device 210 according to the several embodiments set forth in this disclosure. For example, the precursor to the semiconductive first body 214 may be overlaid with a hard mask similar to the hard mask 140 depicted in FIG. 1a, followed by a polysilicon dummy layer such as the patterned polysilicon dummy layer 142 also depicted in FIG. 1a. It may now be understood that further processing may be done to form the prominence according to any prominence architecture embodiments set forth in this disclosure.

Figure 3A:
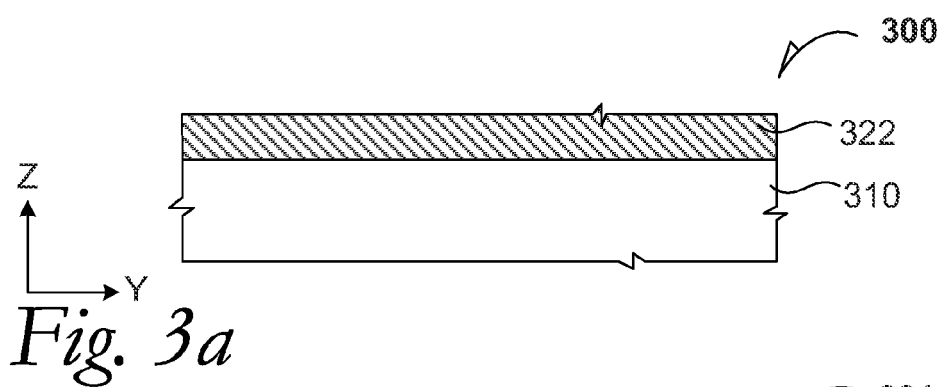
FIG. 3a is a cross-section elevation of a semiconductive device during processing according to an example embodiment.

FIG. 3a is a cross-section elevation of a semiconductive device 300 during processing according to an example embodiment. An epitaxial layer 322 is grown on a semiconductive substrate 310. The epitaxial layer is a precursor of a reverse-bias film 322. Thereafter, thermal processing may be carried out to heal crystal imperfections. In an embodiment, the layer 322 is an implanted layer that forms a precursor of the reverse-bias film 322.

Figure 3B:
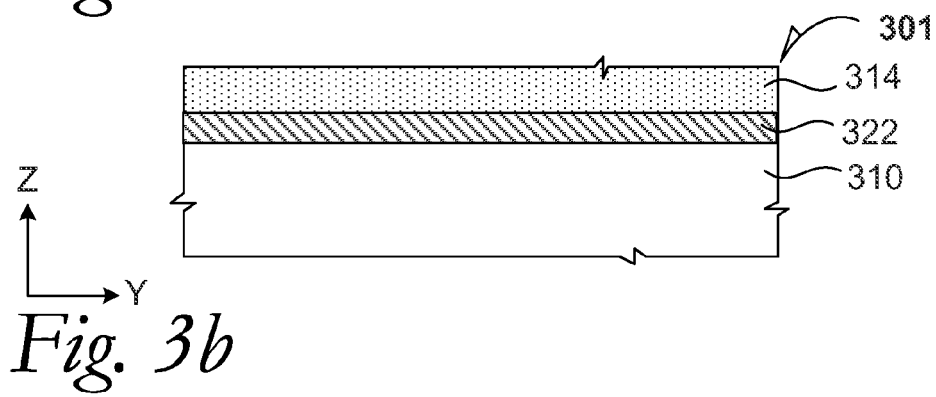
FIG. 3b is a cross-section elevation of the semiconductor device depicted in FIG. 3a after further processing according to an embodiment.

FIG. 3b is a cross-section elevation of the semiconductor device depicted in FIG. 3a after further processing according to an embodiment. The semiconductor device 301 has been processed with a second epitaxial film 314, which is a precursor to a semiconductive first body 314 that will be located in a prominence. It may now be seen that other films may be grown epitaxially such as the architecture depicted in FIGS. 1, 4, and 5 such that, for example, an n-doped and epitaxially grown InSb film (FIG. 4) forms the semiconductive first body 314.

It may now be seen that thermal processing may be done only once after formation of both the precursor to the semiconductive second body 322 and the precursor to the semiconductive first body 314 such that imperfections may be healed in the entire structure.

Further processing may be carried out on the semiconductive device 310 according to the several embodiments set forth in this disclosure. For example, the precursor to the semiconductive first body 314 may be overlaid with a hard mask similar to the hard mask 140 depicted in FIG. 1a, followed by a polysilicon dummy layer such as the patterned polysilicon dummy layer 142 also depicted in FIG. 1a. It may now be understood that further processing may be done to form the prominence according to any prominence architecture embodiments set forth in this disclosure.

Figure 4:
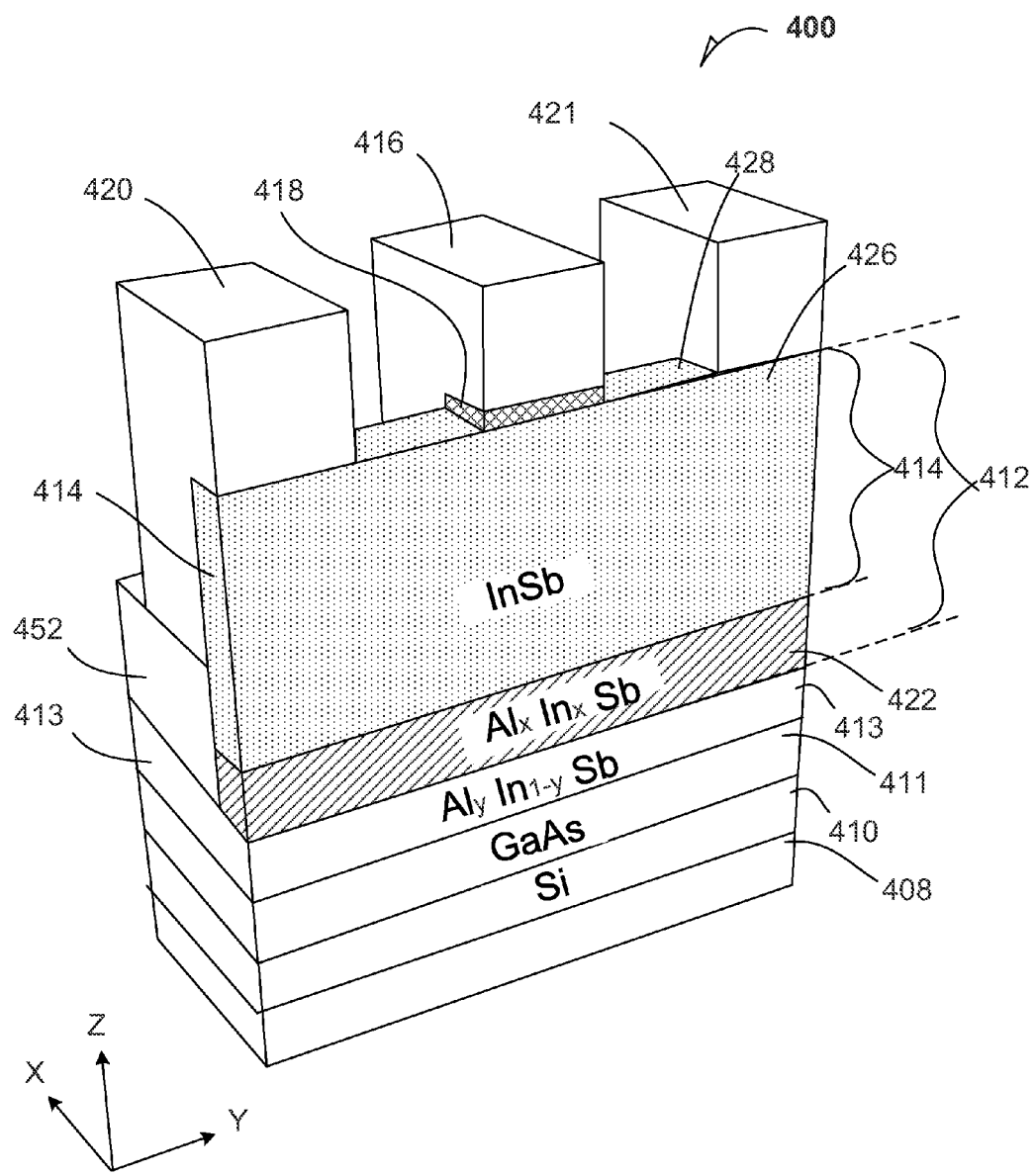
FIG. 4 is a cross-section and cut-away perspective elevation of a semiconductive device according to an example embodiment.

FIG. 4 is a cross-section and cut-away perspective elevation of a semiconductive device 400 according to an example embodiment. The semiconductive substrate 410 may be undoped silicon and the semiconductive first body 414 is n-doped InSb.

The semiconductive device 400 includes a bulk semiconductive substrate 410 which may be disposed above an insulative structure 408 such as an SOI structure 408. In an embodiment, the semiconductive substrate 410 has an epitixailly grown gallium arsenide (GaAs) 411 disposed on it that resolves dislocations, lattice mismatches and other imperfections. An aluminum indium antiminide ($Al_yIn_{1-y}Sb$) film 413 surmounts the GaSb film 411 as well as an aluminum indium antiminide ($Al_xIn_xSb$) film 422 surmounts the $Al_yIn_{1-y}Sb$ film 413. The films 411 and 413 have different chemistries from each other and they act as a buffer for the JAM channel 414. Finally, the semiconductive first body 414 is an indium antiminide (InSb) film 414 that has been n-doped. In an embodiment, any or all of the previous films 422, 413, and 411 is reverse-bias doped with respect to the semiconductive first body 414 such that current leakage is minimized or made negligible. In an embodiment the AlSb film 422 is the semiconductive second body 422 and the InSb film 414 is the semiconductive first body 414.

The prominence 412 as illustrated includes the semiconductive first body 414. The semiconductive first body 414 is a JAM device such as an n-channel junctionless source-channel- and drain device that operates in accumulation mode as a transistor. A gate electrode 416 undulates over the semiconductive first body 414. The gate electrode 416 is insulated from the semiconductive substrate 410 as well as the prominence 412 by a gate dielectric 418. The semiconductive first body is coupled to a source body 420 and a drain body 421. In an embodiment, the prominence 412 includes the reverse-bias band 422 or any of the other films 413 and 411. In comparison to the semiconductive devices 100, 200, and 300 depicted in FIGS. 1 2, and 3, the reverse-bias band 322 is supported by films 411 and 413 to resolve dislocations and to buffer the semiconductive first body 414 as well as the semiconductive second body 422. The semiconductive first body 414 may also be delineated by a first side 426, the edge 428, and a second side (obscured from view). It can now be seen that the semiconductive first body 414 extends (from left to right) from the source body 420, through the gate electrode 416 and to the drain body 421. The entire structure of the semiconductive first body 414 is an n-channel that operates in junctionless accumulation mode according to an example embodiment. The reverse-bias band 422 is disposed opposite the edge 428 and runs the entire length of the semiconductive first body 414.

In an embodiment, where the semiconductive first body 414 is an n-channel, the reverse-bias band 422 is a p-type semiconductive structure that extends beneath the entire length of the semiconductive first body 414. In an embodiment, where the semiconductive first body 414 is an n- or p-doped channel, the reverse-bias band 422 is an undoped semiconductive structure where the doping differential is sufficient to act as a reverse-bias junction.

As a consequence of the doping differential between the semiconductive first body 414 and the semiconductive second body 422, the JAM semiconductive first body 414 may operate with minimal or even negligible leakage into the semiconductive substrate 410.

Figure 5:
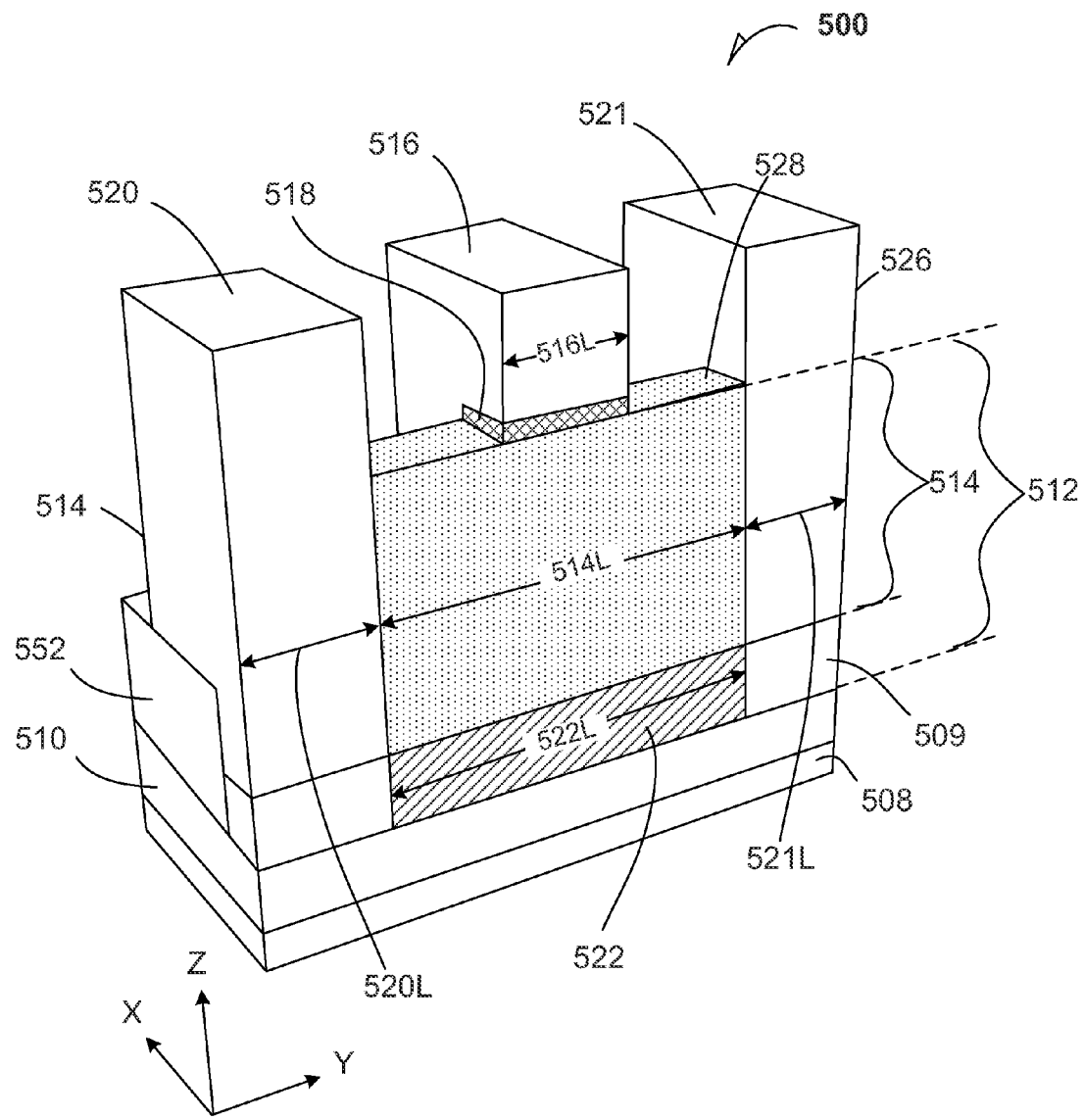
FIG. 5 is a cross-section and cut-away perspective elevation of a semiconductive device according to an example embodiment.

FIG. 5 is a cross-section and cut-away perspective elevation of a semiconductive device 500 according to an example embodiment. The semiconductive device 500 includes a top substrate 510 that may be disposed upon a bottom substrate 508. A prominence 512 includes a semiconductive first body 514 (indicated by a height section 514 of the prominence 512). The prominence 512 also includes a reverse-bias band 522 that is set within a dielectric 509. The semiconductive first body 514 is a JAM device such as an n-channel junctionless source-channel- and drain device that operates in accumulation mode as a transistor. In an embodiment, the semiconductive first body 514 operates in quantum-well fashion due to the width in the X direction. In an embodiment, the semiconductive first body 514 has a width in a range from 1 nm to 100 nm.

A gate electrode 516 is insulated from the substrate 510 by an STI 552. The semiconductive first body 514 is coupled to a source body 520 and a drain body 521. The source- and drain bodies 520 and 521, respectively, may also be referred to as contact pads to receive a contact for functioning of the semiconductive first body 514 in JAM operation.

The semiconductive first body 514 has a first length 514L and the source- and drain bodies 520 and 521 also have source- and drain body lengths 520L and 521L respectively. The gate electrode 516 also has a third length 516L. The reverse bias band 522 also has a second length 522L.

In an embodiment, the source- and drain bodies 510 and 521, respectively, are formed of semiconductive material that is qualitatively doped the same as the semiconductive first body 114, but they are formed at a different process stage as that of the semiconductive first body 114.

In an embodiment, the first length 514L is the same as the third length 516L such that essentially the entire channel 514 is below (in the Z direction) the gate electrode 516. In an embodiment, the first length 514L is greater than the third length 516L as illustrated in FIG. 5.

As illustrated, the reverse bias band length 522L is the same as that of the first length 514L. In an embodiment, however, the second length 522L is greater than that of the first length 514L such as where the entire channel 514 is below the gate electrode (the first length 514L is essentially the same as that of the third length 516L), but the second length 522L is the length illustrated.

It may now be appreciated that band engineering embodiments disclosed with respect to FIG. 1 may also be applied to channel-reverse bias band-, and gate length embodiments disclosed with respect to FIGS. 1, 4, and 5. In an example embodiment, the structure 522 is GaAs and has the second length 522L as illustrated, and the channel 514 is Ge and has a length 514L that is the same as that of the gate electrode length 516L.

Figure 6:
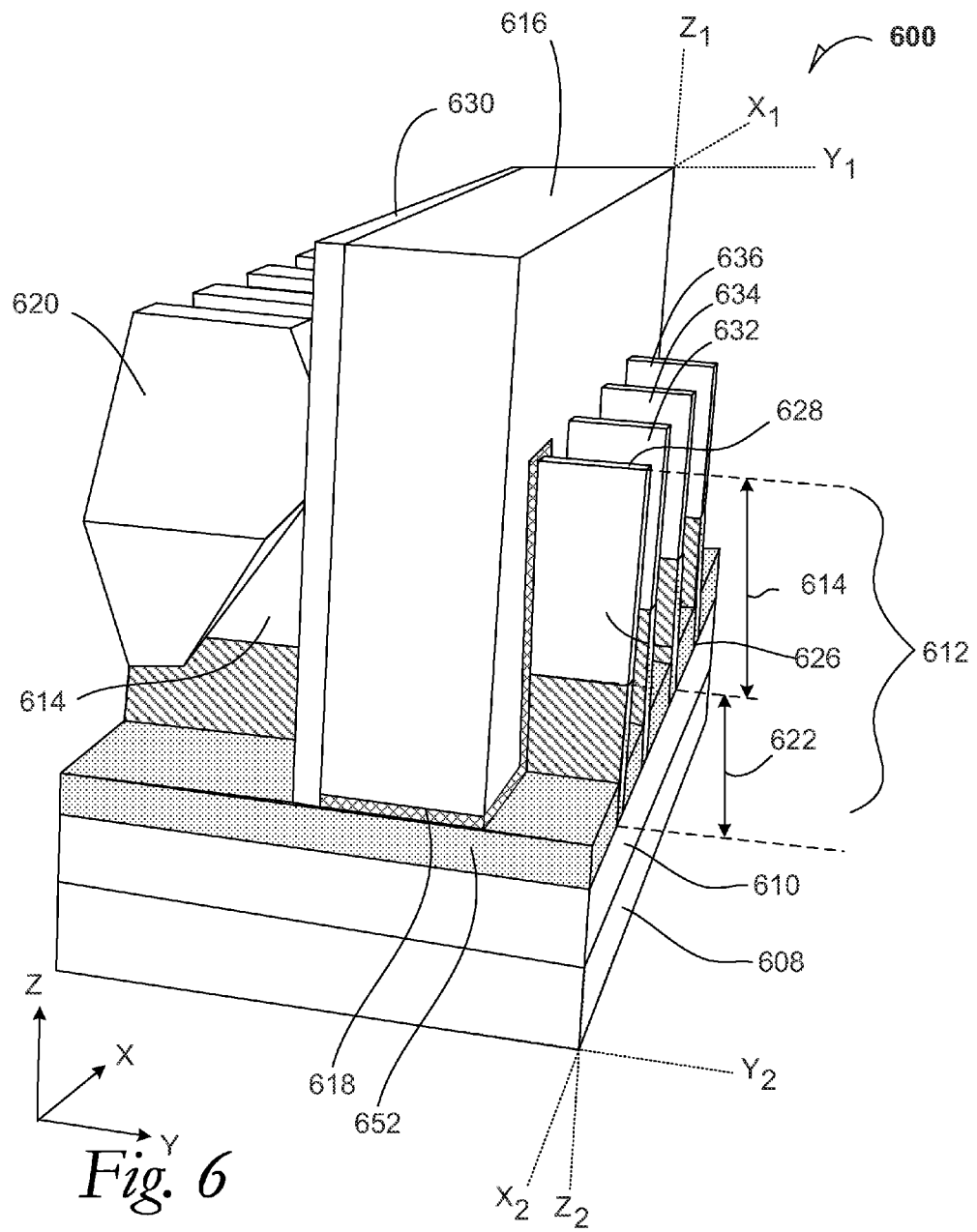
FIG. 6 is a cross-section and cut-away perspective elevation of a semiconductive device according to an example embodiment.

FIG. 6 is a cross-section and cut-away perspective elevation of a semiconductive device 600 according to an example embodiment. The semiconductive device 600 includes a bulk semiconductive substrate 610 which may be disposed above an insulative structure 608 such as an SOI structure 608. In an embodiment, the semiconductive substrate 610 is an epitaxially grown film. A prominence 612 includes a semiconductive first body 614 (indicated by a height section 614 of the prominence 612). The semiconductive first body 614 is a JAM device such as an n-channel junctionless source-channel- and drain device that operates in accumulation mode as a transistor. The semiconductive device 600 is displayed with at least two cut-away views. A cut-away view is seen with the $X_1 Z_1$ plane, which is cut into a gate electrode 616 that undulates over the semiconductive first body 614. The gate electrode 616 is insulated from the semiconductive substrate 610 by and STI 652. The prominence 612 is insulated by a gate dielectric 618. The gate electrode 616 is also exposed by a cut-away plane $X_2 Y_2$. The semiconductive first body 614 is coupled to a source body 620 and a drain body (not illustrated). The source body 620 may also be referred to as a contact pad 620 to receive a contact for functioning of the semiconductive first body 614 in JAM operation. The semiconductive first body 614 is cut by a plane $X_2 Z_2$ before the drain body is reached.

The prominence 612 also includes a reverse-bias band 622. The form factor of the semiconductive substrate 610 abuts the reverse-bias band 622. The semiconductive first body 614 may also be delineated by a first side 626, the edge 628, and a second side (obscured from view). It can now be seen that the semiconductive first body 614 extends (from left to right) from the source body 620, through the gate electrode 616 and toward the drain body. Another structure depicted in FIG. 6 is a gate spacer 630 that has also been depicted in cut away perspective at the cut-away planes $X_1 Y_1$ and $Y_2 Z_2$.

The entire structure of the semiconductive first body 614 is an n-channel that operates in junctionless accumulation mode according to an example embodiment. In an embodiment, the entire structure of the semiconductive first body 614 is a p-channel that operates in junctionless accumulation mode. The reverse-bias band 622 is disposed opposite the edge 628 and runs the entire length of the semiconductive first body 614.

In an embodiment, where the semiconductive first body 614 is an n-channel, the reverse-bias band 622 is a p-type semiconductive structure that extends beneath the entire length of the semiconductive first body 614. In an embodiment, where the semiconductive first body 614 is a p-channel, the reverse-bias band 622 is an n-type semiconductive structure that extends beneath the entire length of the semiconductive first body 614. As a consequence of the doping differential between the semiconductive first body 614 and the semiconductive second body 622, the JAM semiconductive first body 614 may operate with minimal or even negligible leakage into the semiconductive substrate 610.

Other prominences 632, 634, and 636 are also illustrated but in not as much detail as the prominence 612 containing the semiconductive first body 614. It can be seen that the semiconductive second body 622 has a height (in the Z direction) that begins upon the semiconductive substrate 610 and extends above the STI 652.

Figure 7:
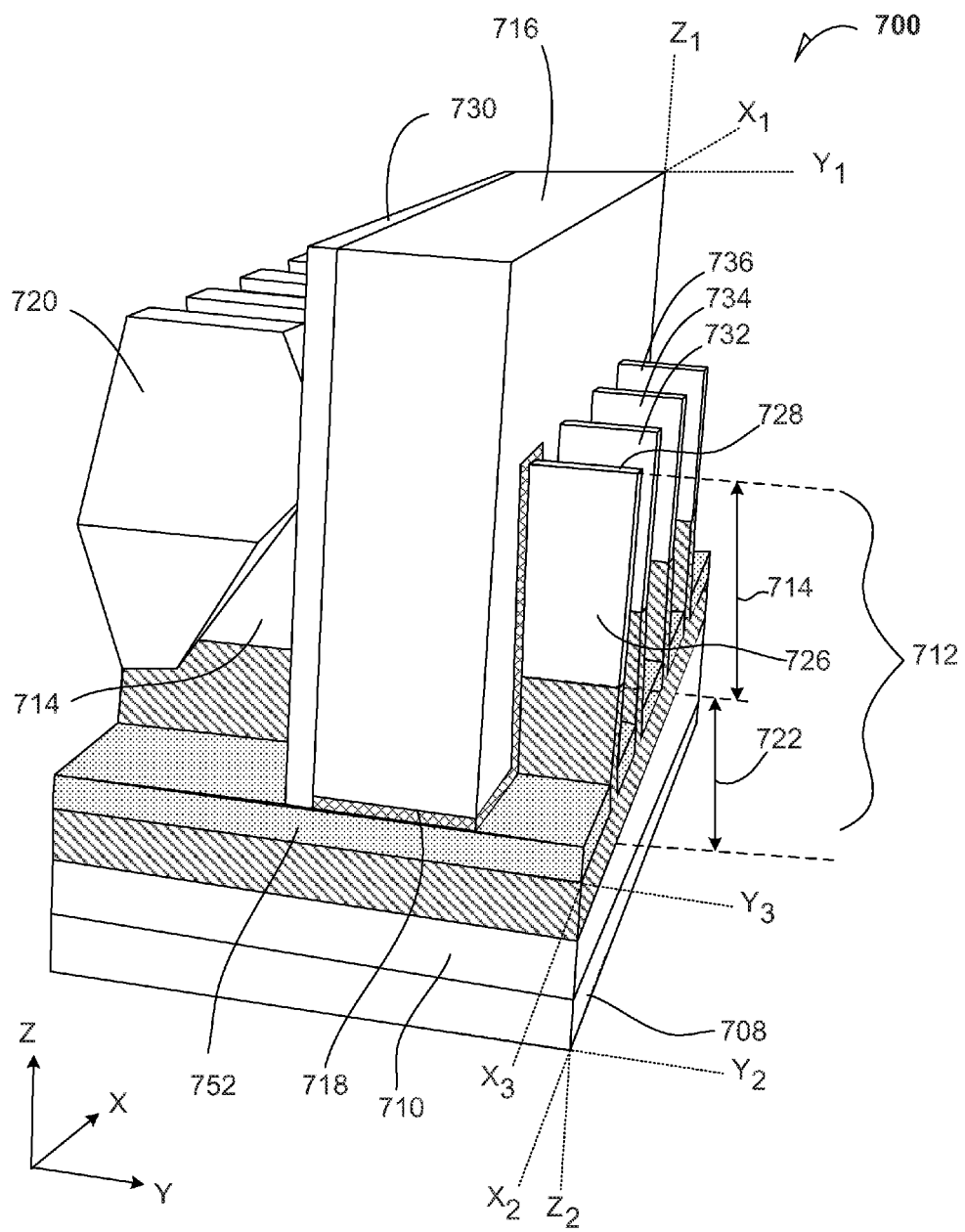
FIG. 7 is a cross-section and cut-away perspective elevation of a semiconductive device according to an example embodiment.

FIG. 7 is a cross-section and cut-away perspective elevation of a semiconductive device 700 according to an example embodiment. The semiconductive device 700 includes a bulk semiconductive substrate 710 which may be disposed above an insulative structure 708 such as an SOI structure 708. A prominence 712 includes a semiconductive first body 714 (indicated by a height section 714 of the prominence 712). The semiconductive first body 714 is a JAM device such as an n-channel junctionless source-channel- and drain device that operates in accumulation mode as a transistor according to an example embodiment. The semiconductive device 700 is displayed with at least two cut-away views. A cut-away view is seen with the $X_1 Z_1$ plane, which is cut into a gate electrode 716 that undulates over the semiconductive first body 714. The gate electrode 716 is insulated from the semiconductive substrate 710 by an STI 752. The prominence 712 is insulated by a gate dielectric 718. The gate electrode 716 is also exposed by a cut-away plane $X_2 Y_2$. The semiconductive first body is coupled to a source body 720 and a drain body (not illustrated). The semiconductive first body 714 is cut by a plane $X_2 Z_2$ before the drain body is reached.

The prominence 712 also includes a reverse-bias band 722. Etching the prominence 712 to a height that stops at a level in the middle of the reverse-bias band 722 is done such that the reverse-bias band 722 completely overlies the semiconductive substrate 710. The semiconductive first body 714 may also be delineated by a first side 726, the edge 728, and a second side (obscured from view). It can now be seen that the semiconductive first body 714 extends (from left to right) from the source body 720, through the gate electrode 716 and toward the drain body. Another structure depicted in FIG. 7 is a gate spacer 728 that has also been depicted in cut away perspective at the cut-away planes $X_1 Y_1$ and $Y_2 Z_2$.

The entire structure of the semiconductive first body 714 is an n-channel that operates in junctionless accumulation mode according to an example embodiment. In an embodiment, the entire structure of the semiconductive first body 714 is a p-channel that operates in junctionless accumulation mode. The reverse-bias band 722 is disposed opposite the edge 728 and runs the entire length of the semiconductive first body 714.

In an embodiment, where the semiconductive first body 714 is an n-channel, the reverse-bias band 722 is a p-type semiconductive structure that extends beneath the entire length of the semiconductive first body 714. In an embodiment, where the semiconductive first body 714 is a p-channel, the reverse-bias band 622 is an n-type semiconductive structure that extends beneath the entire length of the semiconductive first body 714. As a consequence of the doping differential between the semiconductive first body 714 and the semiconductive second body 722, the JAM semiconductive first body 714 may operate with minimal or even negligible leakage into the semiconductive substrate 710.

Other prominences 732, 734, and 736 are also illustrated but in not as much detail as the prominence 712 containing the semiconductive first body 714.

Figure 8:
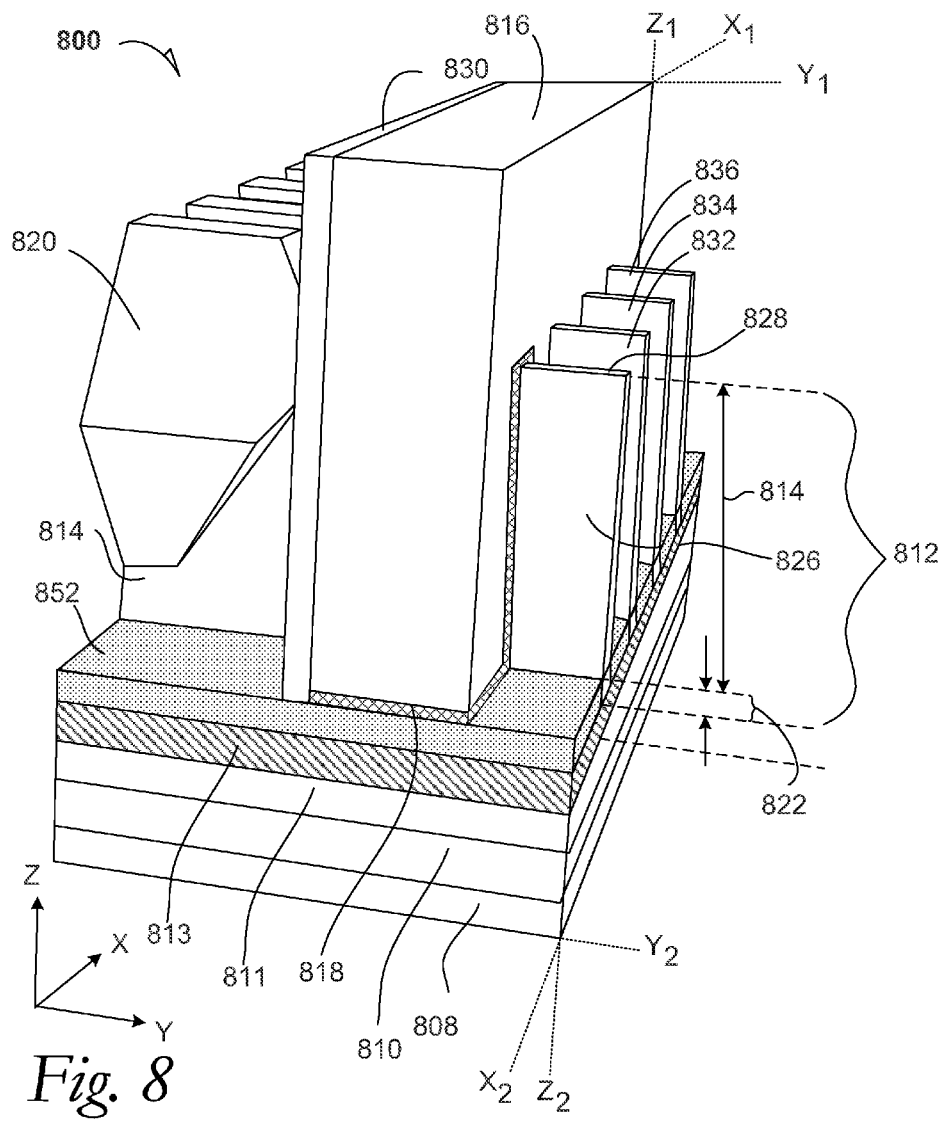
FIG. 8 is a cross-section and cut-away perspective elevation of a semiconductive device according to an example embodiment.

FIG. 8 is a cross-section and cut-away perspective elevation of a semiconductive device 800 according to an example embodiment. The semiconductive device 800 includes a bulk semiconductive substrate 810 which may be disposed above an insulative structure 808 such as an SOI structure 808. In an embodiment, the semiconductive substrate 810 has an epitixailly grown gallium antiminide (GaSb) film 811 disposed on it that resolves dislocations, lattice mismatches and other imperfections. An aluminum arsenide (AlAs) film 813 surmounts the GaSb film 811. An aluminum antiminide (AlSb) film 822 surmounts the AlAs film 813. Finally, the semiconductive first body 814 is an indium antiminide (InSb) film 814 that has been n-doped. In an embodiment, any or all of the previous films 822, 813, and 811 is reverse-bias doped with respect to the semiconductive first body 814 such that current leakage is minimized or made negligible. In an embodiment the AlSb film 822 is the semiconductive second body 822 and the InSb film 814 is the semiconductive first body 814.

The prominence 812 as illustrated includes the semiconductive first body 814. The semiconductive first body 814 is a JAM device such as an n-channel junctionless source-channel- and drain device that operates in accumulation mode as a transistor. The semiconductive device 800 is displayed with at least two cut-away views. A cut-away view is seen with the $X_1 Z_1$ plane, which is cut into a gate electrode 816 that undulates over the semiconductive first body 814. The gate electrode 816 is insulated from the semiconductive substrate 810 by an STI 852. The prominence 812 is insulated by a gate dielectric 818. The gate electrode 816 is also exposed by a cut-away plane $X_2 Y_2$. The semiconductive first body is coupled to a source body 820 and a drain body (not illustrated). The semiconductive first body 814 is cut by a plane $X_2 Z_2$ before the drain body is reached.

The prominence 812 also includes a reverse-bias band 822 or any of the other films 813 and 811. In comparison to the semiconductive device 100 FIG. 1, the reverse-bias band 822 is supported by films 811 and 813 to resolve dislocations and to buffer the semiconductive first body 814 as well as the semiconductive second body 822. The semiconductive first body 814 may also be delineated by a first side 826, the edge 828, and a second side (obscured from view). It can now be seen that the semiconductive first body 814 extends (from left to right) from the source body 820, through the gate electrode 816 and toward the drain body. Another structure depicted in FIG. 8 is a gate spacer 830 that has also been depicted in cut away perspective at the cut-away planes $X_1 Y_1$ and $Y_2 Z_2$.

The entire structure of the semiconductive first body 814 is an n-channel that operates in junctionless accumulation mode according to an example embodiment. The reverse-bias band 822 is disposed opposite the edge 828 and runs the entire length of the semiconductive first body 814.

In an embodiment, where the semiconductive first body 814 is an n-channel, the reverse-bias band 822 is a p-type semiconductive structure that extends beneath the entire length of the semiconductive first body 814. In an embodiment, where the semiconductive first body 814 is an n- or p-doped channel, the reverse-bias band 822 is an undoped semiconductive structure where the doping differential is sufficient to act as a reverse-bias junction.

As a consequence of the doping differential between the semiconductive first body 814 and the semiconductive second body 822, the JAM semiconductive first body 814 may operate with minimal or even negligible leakage into the semiconductive substrate 810.

Other prominences 832, 834, and 836 are also illustrated but in not as much detail as the prominence 812 containing the semiconductive first body 814.

Figure 9:
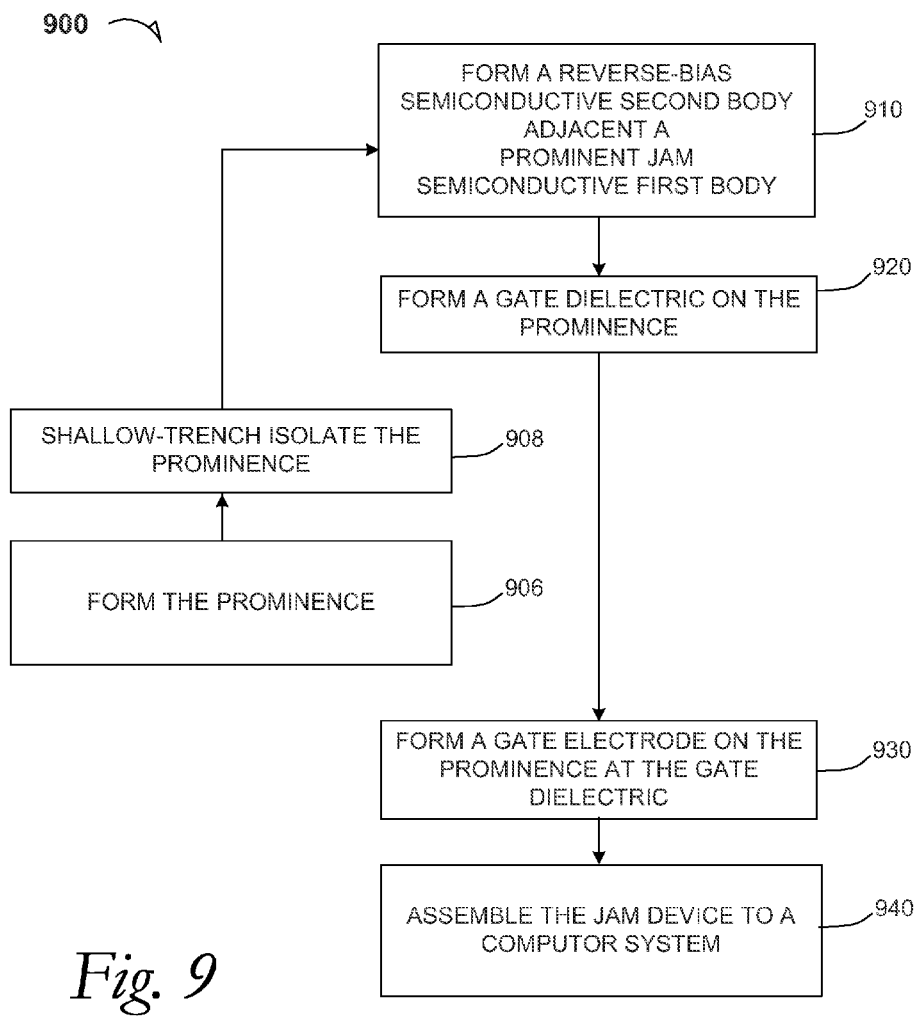
FIG. 9 is a process and method flow diagram according to an example embodiment.

FIG. 9 is a process and method flow diagram 900 according to several embodiments.

At 910, the process includes forming a reverse-biased semiconductive second body adjacent a prominent junctionless accumulation-mode semiconductive first body. In an non-limiting example embodiment, the semiconductive second body 122 is formed adjacent and abutting the semiconductive first body 114 by implanting a reverse-bias dopant through the semiconductive first body 114 as seen in FIG. 1*e*. In a non-limiting example embodiment, the semiconductive second body 622 is formed adjacent and abutting the semiconductive first body 614 by implanting a reverse-bias dopant through the semiconductive first body 614 as seen in FIG. 6*a*. In a non-limiting example embodiment, the semiconductive second body 622 is formed adjacent and abutting the semiconductive first body 614 by implanting a reverse-bias dopant through the semiconductive first body 614 as seen in FIG. 6*b*. In a non-limiting example embodiment, the semiconductive second body 722 is formed adjacent and abutting the semiconductive first body 714 by growing two epitaxial layers 722 and 714, respectively, as seen in FIGS. 7*a* and 7*b*.

In a non-limiting example embodiment, the semiconductive second body is any one of films 411, 413, and 422 and is formed adjacent the semiconductive first body 414 as seen in FIG. 5.

At 906, the process may begin by forming the prominence. In a non-limiting example embodiment, the prominence 112 is formed by etching through the hard mask 144 and the hard mask 140 to form the prominence 112 as seen in FIG. 1*c*.

At 908, the process may continue by isolating the prominence. In a non-limiting example embodiment, the STI 152 is first filled abutting the prominence 112 and then height-lowered by etching back to expose the semiconductive first body 114 and achieve a lowered STI 152 as seen in respective FIGS. 1*d* and 1*f*.

At 920, the process includes forming a gate dielectric on the prominence. In a non-limiting example embodiment, the gate dielectric 118 is patterned on the prominence 112 as seen in FIG. 1.

At 930, the process includes forming a gate electrode on the prominence at the gate dielectric. In a non-limiting example embodiment, the gate electrode 116 is patterned to undulate over the prominences 112, 132, 134, and 136. Details of the gate electrode 116 below the gate dielectric 118 and on the prominences is shown only for the prominence 112, but the gate electrode 116 extends over the prominences 132, 134, and 136 in a similar manner.

At 940, a method embodiment includes installing the JAM device into a computer system.

Figure 10:
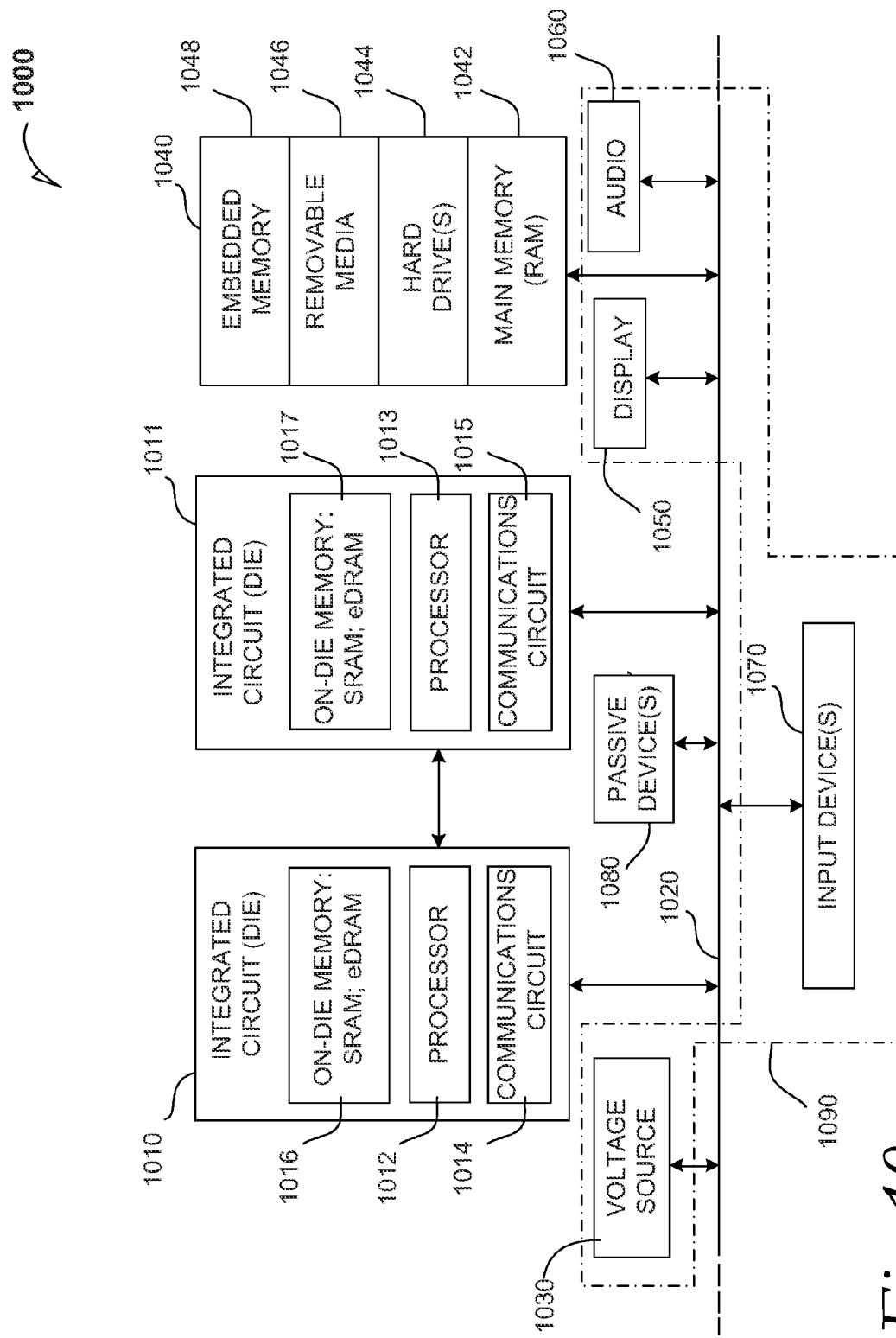
FIG. 10 is a schematic of a computer system according to an embodiment.

FIG. 10 is a schematic of a computer system 1000 according to an embodiment. The computer system 1000 (also referred to as the electronic system 1000) as depicted can embody a JAM device according to any of the several disclosed embodiments and their equivalents as set forth in this disclosure. The computer system 1000 may be a mobile device such as a netbook computer. The computer system 1000 may be a mobile device such as a wireless smart phone In an embodiment, the electronic system 1000 is a computer system that includes a system bus 1020 to electrically couple the various components of the electronic system 1000. The system bus 1020 is a single bus or any combination of busses according to various embodiments. The electronic system 1000 includes a voltage source 1030 that provides power to the integrated circuit 1010. In some embodiments, the voltage source 1030 supplies current to the integrated circuit 1010 through the system bus 1020.

The integrated circuit 1010 is electrically coupled to the system bus 1020 and includes any circuit, or combination of circuits according to an embodiment. In an embodiment, the integrated circuit 1010 includes a processor 1012 that can be of any type. As used herein, the processor 1012 may mean any type of circuit such as, but not limited to, a microprocessor, a microcontroller, a graphics processor, a digital signal processor, or another processor. In an embodiment, the processor 1012 is the embedded die disclosed herein. In an embodiment, SRAM embodiments are found in memory caches of the processor. Other types of circuits that can be included in the integrated circuit 1010 are a custom circuit or an application-specific integrated circuit (ASIC), such as a communications circuit 1014 for use in wireless devices such as cellular telephones, smart phones, pagers, portable computers, two-way radios, and similar electronic systems. In an embodiment, the processor 1010 includes on-die memory 1016 such as static random-access memory (SRAM). In an embodiment, the processor 1010 includes embedded on-die memory 1016 such as embedded dynamic random-access memory (eDRAM). In an embodiment, the processor 1010 is a processor that is installed on a server blade.

In an embodiment, the integrated circuit 1010 is complemented with a subsequent integrated circuit 1011 such as an embedded subsequent die embodiment. The dual integrated circuit 1011 includes a dual processor 1013 and a dual communications circuit 1015 and dual on-die memory 1017 such as SRAM. In an embodiment, the dual integrated circuit 1010 includes embedded on-die memory 1017 such as eDRAM.

In an embodiment, the electronic system 1000 also includes an external memory 1040 that in turn may include one or more memory elements suitable to the particular application, such as a main memory 1042 in the form of RAM, one or more hard drives 1044, and/or one or more drives that handle removable media 1046, such as diskettes, compact disks (CDs), digital variable disks (DVDs), flash memory drives, and other removable media known in the art. The external memory 1040 may also be embedded memory 1048 such as a JAM device according to an embodiment.

In an embodiment, the electronic system 1000 also includes a display device 1090, and an audio output 1060. In an embodiment, the electronic system 1000 includes an input device such as a controller 1070 that may be a keyboard, mouse, trackball, game controller, microphone, voice-recognition device, or any other input device that inputs information into the electronic system 1000. In an embodiment, an input device 1070 is a camera. In an embodiment, an input device 1070 is a digital sound recorder. In an embodiment, an input device 1070 is a camera and a digital sound recorder.

As shown herein, the integrated circuit 1010 can be implemented in a number of different embodiments, including a JAM device according to any of the several disclosed embodiments and their equivalents, an electronic system, a computer system, one or more methods of fabricating an integrated circuit, and one or more methods of fabricating an electronic assembly that a JAM device according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration a JAM device according to any of the several disclosed JAM device embodiments and their equivalents.

Although a die may refer to a processor chip, an RF chip or a memory chip may be mentioned in the same sentence, but it should not be construed that they are equivalent structures. Reference throughout this disclosure to "one embodiment" or "an embodiment" means that a particular feature, structure, or characteristic described in connection with the embodiment is included in at least one embodiment of the present invention. The appearance of the phrases "in one embodiment" or "in an embodiment" in various places throughout this disclosure are not necessarily all referring to the same embodiment. Furthermore, the particular features, structures, or characteristics may be combined in any suitable manner in one or more embodiments.

Terms such as "upper" and "lower" "above" and "below" may be understood by reference to the illustrated X-Z coordinates, and terms such as "adjacent" may be understood by reference to X-Y coordinates or to non-Z coordinates.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A junctionless accumulation mode (JAM) device, comprising:
   a semiconductive first body including a channel region bounded by junctionless source- and drain regions, wherein the semiconductive first body is located in a prominence that extends from and is part of a bulk semiconductive substrate, and wherein the semiconductive first body includes a first side, an edge, and a second side that is parallel-planar to the first side;
   a gate electrode that is wrapped around the prominence on each of the first side, the edge, and the second side; and
   a semiconductive second body disposed opposite the edge and between the semiconductive first body and the bulk semiconductive substrate, wherein the semiconductive second body is differently doped from the semiconductive first body, and wherein the semiconductive second body causes a differential bias with the semiconductive first body, wherein the semiconductive second body also extends from and is part of the bulk semiconductive substrate.

2. The device of claim 1, wherein the semiconductive second body is also disposed within the prominence.

3. The device of claim 1, wherein the semiconductive second body is also disposed within the prominence, and wherein a portion of the semiconductive second body has a form factor similar to the bulk semiconductive substrate.

4. The device of claim 1, wherein the semiconductive second body is also disposed within the prominence, the device further including an undoped portion adjacent the semiconductive second body that is also disposed within the prominence.

5. The device of claim 1, wherein the semiconductive second body abuts the source, channel, and drain regions.

6. The device of claim 1, wherein the bulk semiconductive substrate is disposed above a dielectric material in a silicon-on-insulator (SOI) configuration.

7. The device of claim 1, wherein the semiconductive second body is also disposed within the prominence, and wherein the bulk semiconductive substrate is disposed above a dielectric material in a silicon-on-insulator (SOI) configuration.

8. The device of claim 1, wherein the semiconductive second body is also disposed within the prominence, wherein the bulk semiconductive substrate is disposed above a dielectric material in a silicon-on-insulator (SOI) configuration, and wherein the semiconductive second body abuts the source, channel, and drain regions.

9. The device of claim 1, further including a source body in contact with the source region and a drain body in contact with the drain region, wherein doping of the source- and drain bodies is higher than that of the semiconductive first body.

10. The device of claim 1, further including a source body in contact with the source region and a drain body in contact with the drain region, wherein doping of the source- and drain bodies is the same as that of the semiconductive first body.

11. The device of claim 1, wherein the semiconductive second body is set within a dielectric that is part of the prominence.

12. The device of claim 1, further including a gate dielectric disposed over the prominence, wherein the gate electrode is disposed over the gate dielectric.

13. A junctionless accumulation mode (JAM) device, comprising:
a germanium semiconductive first body including a channel region bounded by junctionless source- and drain regions, wherein the semiconductive first body is located in a prominence that extends from a bulk semiconductive substrate, and wherein the semiconductive first body includes a first side, an edge, and a second side that is parallel-planar to the first side;
a gate electrode that is wrapped around the prominence on each of the first side, the edge, and the second side; and
a gallium arsenide semiconductive second body disposed opposite the edge and between the semiconductive first body and the bulk semiconductive substrate, wherein the semiconductive second body is differently doped from the semiconductive first body, and wherein the semiconductive second body causes a differential bias with the semiconductive first body.

14. The JAM device of claim 13, wherein the gallium arsenide semiconductive second body is undoped.

15. The JAM device of claim 13, wherein the germanium semiconductive first body has a first length, wherein the gallium arsenide semiconductive second body has a second length, wherein the gate electrode has a third length, and wherein the first length is equal to the third length.

16. The JAM device of claim 13, wherein the germanium semiconductive first body has a first length, wherein the gallium arsenide semiconductive second body has a second length, wherein the gate electrode has a third length, wherein the first length is equal to the third length, and wherein the second length is greater than the first length.

17. A junctionless accumulation mode (JAM) device, comprising:
a semiconductive first body including a channel region and having a first length and wherein the semiconductive first body is bounded by source- and drain bodies, wherein the semiconductive first body is located in a prominence that extends from and is part of a bulk semiconductive substrate, and wherein the semiconductive first body includes a first side, an edge, and a second side that is parallel-planar to the first side;
a gate electrode having a third length and that is wrapped around the prominence on each of the first side, the edge, and the second side; and
a semiconductive second body having a second length and that is disposed opposite the edge and between the semiconductive first body and the bulk semiconductive substrate, wherein the semiconductive second body is differently doped from the semiconductive first body, and wherein the semiconductive second body causes a differential bias with the semiconductive first body;
wherein the source- and drain bodies are qualitatively similarly doped as that of the semiconductive first body wherein the semiconductive second body abuts the channel region, and wherein the first length is the same as the third length.

* * * * *